Jan. 12, 1971 TSUNEHARU NITTA ET AL 3,555,376

OHMIC CONTACT ELECTRODE TO SEMICONDUCTING CERAMICS AND A METHOD FOR MAKING THE SAME

Filed Dec. 5, 1966

INVENTORS
TSUNEHARU NITTA
AKIO KUITO
KANEOMI NAGASE
TAKASHI IGUCHI
HIROMITSU TAKI

BY Wenderoth, Lind and Ponack,

ATTORNEYS

United States Patent Office 3,555,376

Patented Jan. 12, 1971

3,555,376

OHMIC CONTACT ELECTRODE TO SEMICONDUCTING CERAMICS AND A METHOD FOR MAKING THE SAME

Tsuneharu Nitta and Akio Kuito, Osaka-fu, Kaneomi Nagase and Takashi Iguchi, Kyoto-shi, and Hiromitsu Taki, Sakai-shi, Japan, assignors to Matsushita Electric Industrial Co., Ltd., Osaka, Japan Filed Dec. 5, 1966, Ser. No. 598,997

Claims priority, application Japan, Dec. 15, 1965, 40/78,430, 40/78,431

Int. Cl. H01l 3/08

U.S. Cl. 317—238 4 Claims

ABSTRACT OF THE DISCLOSURE

An electrode composition, for ohmic contact to an oxide semiconducting ceramic, consisting of a nickel-phosphorus alloy, the alloy containing 85–99.5% by weight of nickel and 0.5–15% by weight of phosphorus, and a method for making same by electroless plating.

This invention relates to an ohmic contact electrode to be applied to semiconducting ceramics and more particularly to a method for making the same by electroless plating.

A low-resistance ohmic contact to ferrite and semiconducting titanate ceramics has been effected by rubbing indium wetted with mercury or gallium on the surface. A drawback of the contact produced by this method is low mechanical strength, low stability with temperature and difficulty in soldering lead wires thereon. Recently, D. R. Turner and H. A. Sauer have disclosed that a nickel contact obtained by electroless plating produces a low-resistance ohmic contact to semiconducting ceramics such as barium titanate (Journal of the Electrochemical Society, vol. 107, No. 3, p. 250 1960). According to their report, the nickel contact formed on the ceramics by the electroless plating is nonohmic as deposited and is required to be heated at about 170° C. for obtaining a satisfactory ohmic contact.

Therefore, it is a principal object of this invention to provide a method for making an ohmic contact to a semiconducting ceramic by employing electroless plating in a more simple manufacturing step.

It is a further object of the invention to provide an ohmic contact electrode composition characterized by high mechanical strength and high stability with temperature and time.

It is another object of the invention to provide an electrical circuit element comprising a semiconducting ceramic provided with an ohmic contact of a high reliability with respect to electrical performance.

These and other objects of this invention will become apparent upon consideration of the following description taken together with the accompanying drawings in which.

According to the invention, it has been discovered that nickel-phosphorus alloy is strongly attached to oxide semiconducting ceramics by a method which comprises depositing nickel-phosphorus alloy by chemical reduction, i.e. by an "electroless process," on appropriate surfaces of the ceramics and that nickel-phosphorus alloy produces a low-resistance ohmic contact without any additional procedures. Oxide semiconducting ceramics provided with said nickel-phosphorus alloy contact can be used as electrical circuit elements such as a thermistor, a resistor and an electric heater of high reliability in accordance with the invention.

The process according to the invention is based on the controlled autocatalytic reduction of nickel cations by means of hypophosphite anions in the presence of water. The significant gross equations can be written:

$$\underset{\text{Nickel Cation}}{Ni^{++}} + \underset{\text{Hypophosphite Anion}}{[H_2PO_2]^-} + \underset{\text{Water}}{H_2O} \xrightarrow{\text{Catal. }(Ni^\circ)} \underset{\text{Metallic Nickel}}{Ni^\circ} + \underset{\text{Hydrogen Cations}}{2H^+} + \underset{\text{Acid Orthophosphite Anions}}{H[HPO_3]^-} \quad [I]$$

Concurrently, more hypophosphite anions are oxidized to orthophosphite anions with evolution of gaseous (molecular) hydrogen through the catalytic action of the metallic nickel formed in reaction (I):

$$[H_2PO_2]^- + H_2O \xrightarrow{\text{Catal. }(Ni^\circ)} H[HPO_3] + H_2\uparrow \quad [II]$$

Furthermore, the hypophosphite anion is reduced by atomic hydrogen, yielding elemental phosphorus, water and hydroxyl ion according to the equation:

$$[H_2PO_2]^- + H[Cat.] \rightarrow H_2O + OH^- + P \quad (III)$$

The elemental phosphorus is immediately bonded to the nickel, making the reaction irreversible. Equation (III) clearly shows that the deposition of phosphorus in the electroless solution is dependent on the pH value of the solution. Thus, nickel-phosphorus alloy can be obtained by the above-mentioned process.

Figure 1:
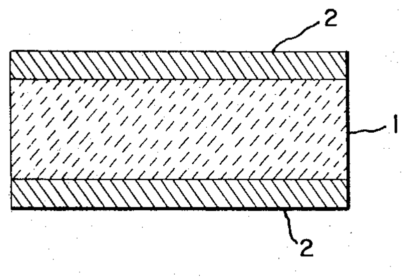
FIG. 1 is a cross-sectional view of a ceramic body containing an electroless deposited alloy in accordance with this invention.

Referring now to FIG. 1, the disc-shaped n-type semiconductive barium titanate ceramic 1 is provided with nickel-phosphorus alloy 2 by depositing nickel-phosphorus alloy by the aforedescribed electroless process.

An alloy containing a phosphorus content higher than 15% by weight is not desirable for use in a contact electrode because the high amount of phosphorus results in an extensive oxidation at the free surface and prevents good electrical or mechanical connection to a soldered lead wire. Pure nickel or the alloy containing a phosphorus content lower than 0.5% by weight cannot be utilized for application of an ohmic contact electrode because a higher resistance barrier layer is formed between the semiconductive oxide ceramic and the electrode. The following proportions of phosphorus to nickel can be used:

TABLE 1

| | Operable proportions, percent | Optimal proportions, percent |
|---|---|---|
| Nickel | 85 to 99.5 | 90 to 99 |
| Phosphorus | 0.5 to 15 | 1 to 10 |

The semiconductive barium titanate ceramic can be prepared by mixing barium carbonate and titanium oxide in an equimolecular ratio with or without addition of a small amount of excess of titanium oxide, pressing into the form of a disc, and sintering at about 1300° to 1400° C. in a nonoxidizing atmosphere such as nitrogen and argon.

The mixture may be doped with rare earth element oxide and, when desired, may be calcined at 800° to 1000° C. prior to sintering.

The process of depositing nickel-phosphorus alloy on an oxide ceramic semiconductor is carried out by the following method: (1) in advance of the depositing treatment, the ceramic object, which is to have its surfaces coated, is cleaned by any of the acceptable and conventional procedures, and (2) the area to be coated with nickel-phosphorus alloy is activated by dipping for about one minute in a solution of 1.0% of stannous chloride ($SnCl_2$) and subsequently for about one minute in a solution of 0.0001% of palladium chloride ($PdCl_2$); and (3) the object to be coated is then immersed in the electroless bath. Ten minutes in the electroless solution result in the deposition of a layer of nickel-phosphorus alloy of about one micron in thickness. It is necessary that the solution temperature be kept at 90° to 100° C. during immersing. The operable electroless solution is of the following composition:

TABLE 2

| | Grams |
|---|---|
| $NiCl \cdot 6HO$ | 3.0 |
| $NaH_2PO_2 \cdot H_2O$ | 1.0 |
| $Na_3C_6H_5O_7 \cdot 2H_2O$ | 1.5 |
| $H_2O$ | Remainder |
| Total | 100 |

The soluble nickel chloride serves as the source of the nickel ions and the nickel deposition, and the hypophosphite serves as the reducing agent and the source of the phosphorus. Sodium citrate serves to hold nickel salts in solution. The pH value of the solution can be controlled, in a conventional manner, by addition of an aqueous solution of ammonium chloride, ammonium hydroxide or hydrogen chloride. The ammonium chloride and ammonium hydroxide serve to maintain the solution alkylinity and also to hold the nickel salt in solution. The hydrogen chloride serves to maintain the solution acidity.

Phosphorus-concentrations of deposited alloys increase as the pH value decreases from 10 to 2. Good results can be obtained by employing a solution of a pH value of 3 to 10. Table 3 shows compositions of deposited alloys determined by chemical analysis as a function of the pH value.

TABLE 3

| pH value of the solution | Compositions (percentages by weight) | |
|---|---|---|
| | Nickel | Phosphorus |
| 2 | 83.2 | 16.8 |
| 3 | 85.7 | 14.3 |
| 4 | 87.2 | 12.8 |
| 5 | 91.8 | 8.2 |
| 6 | 93.2 | 6.8 |
| 10 | 96.6 | 3.4 |
| 12 | 99.7 | 0.3 |

The alloy contact according to the invention has such high resistance to oxidation that no appreciable oxidation is observed up to 600° C. in air though pure nickel contact according to the prior art oxidizes easily when heated above 300° C. in air. It has been discovered that said alloy contact is improved in bonding strength to the semiconducting ceramic and in mechanical hardness. The conventional nickel contact is required to be heated at about 170° C. for achieving an ohmic contact to the ceramic. The novel alloy contact exhibits an ohmic contact to the ceramic as deposited. Therefore, heat treatment according to the invention has different purpose from that of the prior art.

It is preferable for obtaining a high bonding strength and a high mechanical hardness to heat said alloy contact applied to the ceramic below 600° C. in air.

Figure 2:
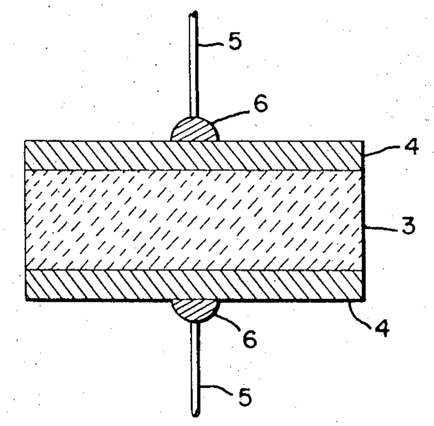
FIG. 2 is a cross-sectional view of a thermistor device in accordance with this invention.

Referring to FIG. 2, the disk-shaped n-type semiconductive barium titanate ceramic 3 is provided with electrodes 4 at both surfaces of the ceramic by depositing nickel-phosphorus alloy and subsequently heating the contacts below 600° C. in air. Lead wires 5 are soldered to the electrodes 4 with a lead-tin solder 6. The ceramic 3 is shown as a flat wafer, but it may be a pellet or rod or of other shape.

The following examples of presently-preferred embodiments are given by way of illustration and should not be construed as limitative.

EXAMPLES 1 TO 8

Semiconductive barium titanate is made in per se conventional manner. Equimolecular mixtures of titanium oxide and barium carbonate are wet milled with 0.2% of silver oxide, pressed into a disc 10 mm. in diameter and 3 mm. thick and sintered at 1300° C. for 2 hours in nitrogen atmosphere. The sintered body, in blue-black color, is 8 mm. in diameter and 2 mm. thick and has 20 ohms of electrical resistance. Various contact electrodes as listed in Table 4 were attached on the semiconductive barium titanate ceramic by the following process.

The ceramics are cleaned in a boiling aqueous solution of 5% of sodium hydrocarbonate ($NaHCO_3$), and the area to be coated with alloy is activated by dipping first for one minute in an aqueous solution of 1.0% of stannous chloride ($SCl_2$) and subsequently for one minute in an aqueous solution of 0.0001% of palladium chloride ($PdCl_2$). The objects to be coated are immersed in the electroless bath composed of an aqueous solution of 3.0 grams of nickel chloride, 1.0 gram of hypophosphite, 1.5 grams of sodium citrate, and ammonium chloride and ammonium hydroxide or hydrogen chloride for adjusting the pH value per 100 grams of said solution. Ten minutes in the electroless solution (solution temperature ~95° C.) deposit a layer of nickel-phosphorus alloy about one micron thick. Electrical resistivity is measured by a per se well know method, and is shown in Table 4. The samples containing nickel-phosphorus alloy consisting of 90 to 99% by weight of nickel and 1 to 10% by weight of phosphorus result in low-resistance ohmic contacts. Tests of the resulting electrical circuit element devices indicate that the resistance of the entire group averages closely to 20 ohms, which is essentially the resistance of the semiconductive material itself. In addition, the electrodes so produced have an excellent bonding strength. Fifty samples are subjected to a test cycling from 70° C. to 200° C. by 2,000 cycles. After the test, forty-five samples show no change in the electrical resistance and only five samples show a slight increase in the electric resistance. This is indicative of the extremely high stability and the low ohmic resistance of the contacts applied to the devices in accordance with the present invention.

While the foregoing is specific to applying nickel-phosphorus alloy coatings to the particular semiconductor composition described herein, it should be understood that said coatings may be applied with equal success to oxide ceramic semiconductor bodies comprising other compositions such as ferrites, thermoelectric members, etc.

TABLE 4

| Sample No. | pH value of electroless solution | Composition of alloy in weight percentages | | Electrical resistance at 25° C. at 1 volt (D.C.) (ohm-cm.) |
|---|---|---|---|---|
| | | Ni | P | |
| 1 | 2 | 83.2 | 16.8 | 23.0 |
| 2 | 3 | 85.7 | 14.3 | 19.8 |
| 3 | 4 | 87.2 | 12.8 | 20.1 |
| 4 | 5 | 91.8 | 8.2 | 20.3 |
| 5 | 6 | 93.2 | 6.8 | 20.0 |
| 6 | 8 | 94.3 | 5.7 | 20.4 |
| 7 | 10 | 96.6 | 3.4 | 20.6 |
| 8 | 12 | 99.7 | 0.3 | 6,230 |

What is claimed is:

1. An ohmic contact electrode composition, in contact with an oxide semiconducting ceramic, consisting essentially of nickel-phosphorus alloy, said alloy being composed of 85 to 99.5% by weight of nickel and 0.5 to 15% by weight of phosphorus.

2. An ohmic contact electrode composition as defined in claim 1, wherein said alloy consists of 90 to 99% by weight of nickel and 1 to 10% by weight of phosphorus.

3. An ohmic contact electrode composition comprising an oxide semiconducting ceramic and electrodes on the surfaces thereof, said electrodes consisting essentially of nickel-phosphorus alloy, said alloy being composed of 90 to 99% by weight of nickel and 1 to 10% by weight of phosphorus.

4. An ohmic contact electrode composition as claimed in claim 3, wherein said oxide semiconducting ceramic comprises semiconductive barium titanate.

References Cited

UNITED STATES PATENTS

| | | | |
|---|---|---|---|
| 3,208,139 | 9/1965 | Wijburg | 29—492 |
| 2,922,730 | 1/1960 | Feldman | 117—221 |
| 3,331,996 | 7/1967 | Green | 317—234 |
| 3,443,170 | 5/1969 | Pulvari | 317—234 |
| 3,419,758 | 12/1968 | Nitta et al. | 317—230 |

FOREIGN PATENTS

| | | | |
|---|---|---|---|
| 487,263 | 6/1938 | Great Britain | 317—234 |

JOHN W. HUCKERT, Primary Examiner

M. EDLOW, Assistant Examiner

U.S. Cl. X.R.

317—234; 310—9.4, 9.5